US012784820B2

(12) United States Patent
Raj et al.

(10) Patent No.: US 12,784,820 B2
(45) Date of Patent: Nov. 3, 2026

(54) TIME MULTIPLEXING OF CLEANUP AND WRITE FOR SERIAL READ WRITE MEMORY

(71) Applicant: QUALCOMM Incorporated, San Diego, CA (US)

(72) Inventors: Pradeep Raj, Gorakhpur (IN); Akshdeepika Lnu, Jalandhar (IN); Abhishek Dalal, Indore (IN); Rahul Sahu, Bangalore (IN); Sharad Kumar Gupta, Bangalore (IN); Sherin Bose, Bangalore (IN); Sakshi Singhal, Muzaffarnagar (IN)

(73) Assignee: QUALCOMM Incorproated, San Diego, CA (US)

( * ) Notice: Subject to any disclaimer, the term of this patent is extended or adjusted under 35 U.S.C. 154(b) by 122 days.

(21) Appl. No.: 18/402,137

(22) Filed: Jan. 2, 2024

(65) Prior Publication Data

US 2025/0218506 A1 Jul. 3, 2025

(51) Int. Cl.
*G11C 11/419* (2006.01)
*G11C 7/12* (2006.01)
*G11C 7/22* (2006.01)

(52) U.S. Cl.
CPC .............. *G11C 11/419* (2013.01); *G11C 7/12* (2013.01); *G11C 7/22* (2013.01)

(58) Field of Classification Search
CPC ............ G11C 11/419; G11C 7/12; G11C 7/22
USPC .................................................... 365/189.02
See application file for complete search history.

(56) References Cited

U.S. PATENT DOCUMENTS 6,563,730 B1 * 5/2003 Poplevine ............. G11C 11/412 365/189.16
10,916,275 B1 * 2/2021 Ghosh ................... G11C 11/419
2015/0109865 A1 4/2015 Gulati et al.
2016/0372167 A1 12/2016 Desai et al.
2022/0366944 A1 * 11/2022 Lee .......................... G11C 8/08

FOREIGN PATENT DOCUMENTS

WO 2018175093 A1 9/2018

OTHER PUBLICATIONS

International Search Report and Written Opinion—PCT/US2024/060855—ISA/EPO—May 16, 2025.
Partial International Search Report—PCT/US2024/060855—ISA/EPO—Mar. 18, 2025.

* cited by examiner

*Primary Examiner* — Huan Hoang
(74) *Attorney, Agent, or Firm* — Loza & Loza, LLP

(57) ABSTRACT

A static random-access memory is provided with a double-pumped operation in which a read operation to a multiplexed group of columns of bitcells may occur in a first portion of a memory clock cycle and in which a write operation to a write-selected column in the multiplexed group of columns of bitcells may occur in a second portion of the memory clock cycle. The write operation to the write-selected column occurs without any precharging of bit lines in the write-selected column during read and write operations.

21 Claims, 8 Drawing Sheets

-- Prior Art --

-- Prior Art --

TIME MULTIPLEXING OF CLEANUP AND WRITE FOR SERIAL READ WRITE MEMORY

TECHNICAL FIELD

The present application relates generally to memories and, more specifically, to a serial read write memory with time multiplexed cleanup and write operations.

BACKGROUND

Modern processors often have multiple cores in which each core may read and write to a memory. Should the various cores have to share a single access port for both read and write operations to a memory, the computing speed may be affected due to collisions between the cores at the common access port. Multi-port memories have thus been developed that have separate read and write ports.

Although the inclusion of separate read and write ports is advantageous with respect to memory access, the access transistors, word line, and bit line(s) for each port increase the memory complexity and demand more die space on the semiconductor die in which the memory is integrated. Pseudo-dual-port (PDP) memories have thus been developed in which a common access port is first treated as a separate read port and then as a separate write port during a single memory clock cycle. Should the read and write operations occur to the same word line, the word line is first asserted for the read operation, discharged, and then asserted for the write operation. This repeated pulsing of the word line may also be denoted as a "double pumped" operation.

SUMMARY

In accordance with an aspect of the disclosure, a serial read write memory is provided that includes: a bank of bitcells arranged into a plurality of columns, wherein the plurality of columns includes a multiplexed group of columns; a write column multiplexer configured to select for a write-selected column from the multiplexed group of columns during a write operation, wherein the multiplexed group of columns includes a write-unselected column; a first precharge circuit configured to charge a first pair of bit lines in the write-selected column to a memory power supply voltage responsive to an assertion of a first bit line precharge signal; and a second precharge circuit configured to charge a second pair of bit lines in the write-unselected column to the memory power supply voltage responsive to an assertion of a second bit line precharge signal.

In accordance with another aspect of the disclosure, a method of operation for a serial read write memory is provided that includes: performing a read operation to a multiplexed group of columns during a first portion of a memory clock cycle, wherein the multiplexed group of columns includes a write-selected column and an at least one write-unselected column, and wherein the memory clock cycle is divided into the first portion and a second portion; selecting for the write-selected column through a write column multiplexer to couple a bitcell in the write-selected column to a write driver in response to a termination of the first portion of the memory clock cycle while precharging a pair of bit lines in the at least one write-unselected column; and writing to a bitcell in the write-selected column using the write driver during the second portion of the memory clock cycle.

In accordance with yet another aspect of the disclosure, a pseudo-dual-port memory is provided that includes: a bank of bitcells arranged into a plurality of columns and into a plurality of rows, wherein the pseudo-dual-port memory is configured to assert a word line voltage for one of the rows during a read operation to the bank of bitcells in a first portion of a memory clock cycle and to assert the word line voltage during a write operation to a write-selected column in the plurality of columns in a second portion of the memory clock cycle; and a precharge generation circuit configured to control a precharge of each column prior to the read operation and to prevent a precharge of the write-selected column during the memory clock cycle.

Finally, in accordance with another aspect of the disclosure, a method of operation for a serial read write memory is provided that includes: discharging a first bit line in a write-selected column from a pre-charged state to a partially-discharged state during a read operation in a first portion of a memory clock cycle; and fully discharging the first bit line from the partially-discharged state to ground during a write operation in a second portion of the memory clock cycle.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
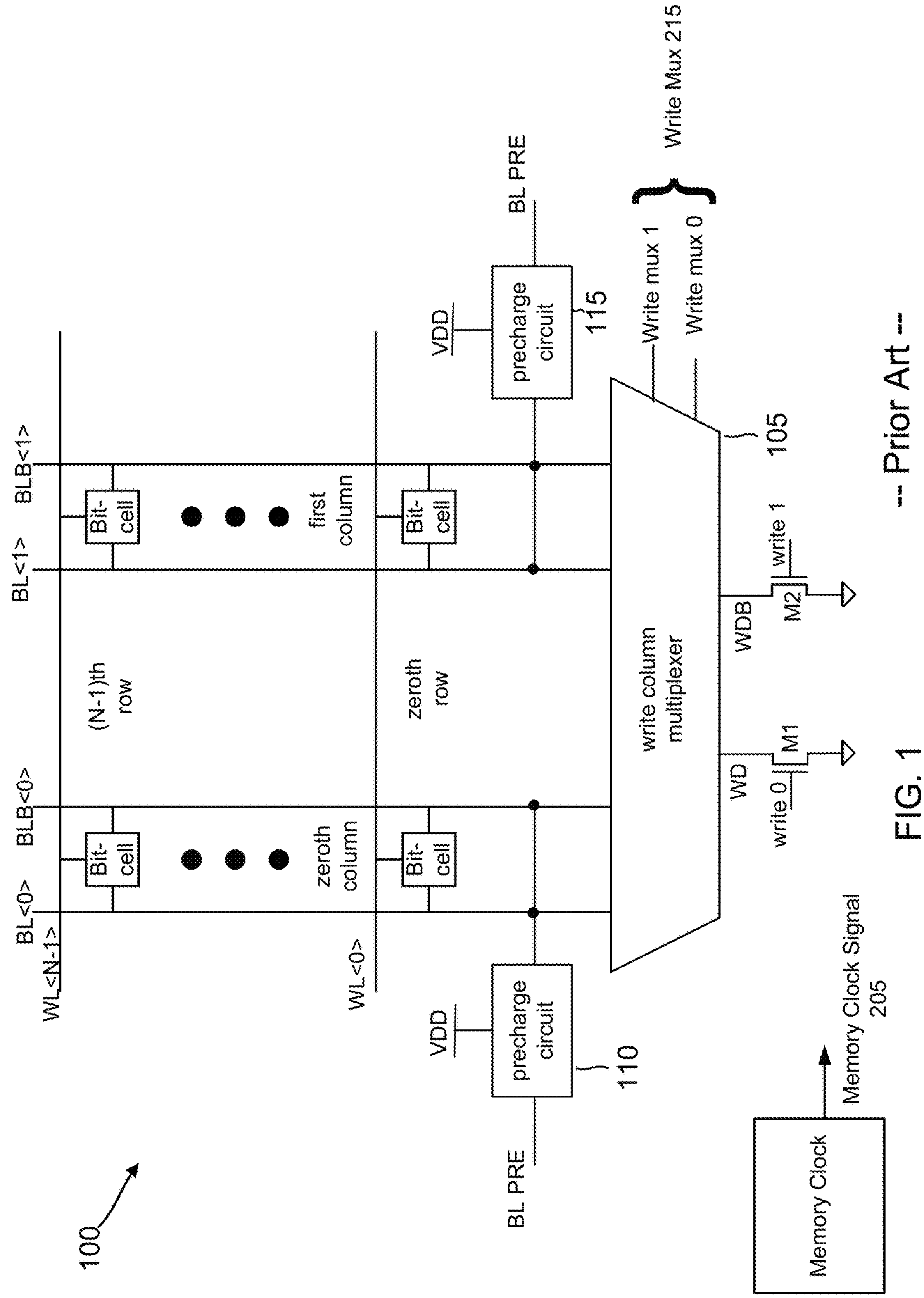
FIG. 1 is a circuit diagram of a bank including a traditional multiplexed group of columns.

Enhanced serial read write memories are disclosed with increased operating speed and reduced power consumption. Before discussing these memories in more detail, some memory concepts will first be discussed. A memory such as a static random-access memory (SRAM) typically includes many bitcells that are arranged into rows and columns. A word line traverses each row of bitcells. Similarly, a pair of bit lines traverses each column of bitcells. Should the rows and columns be organized into a single array, the corresponding word line and bit lines must be relatively long, which increases capacitance and can slow memory operation. It is thus traditional for the bitcells to be organized into banks, each bank having its own columns and rows. Should the bitcells in each bank be pseudo-dual-port bitcells, the resulting memory may be referred to as a serial read write memory in that a read operation is followed by a write operation in a single memory clock cycle.

During the read operation, sense amplifiers sense the voltage differences to read the binary contents stored in the accessed bitcells. Each sense amplifier occupies a certain amount of space on the semiconductor die. With respect to the integration into the semiconductor die, the columns are spaced apart from each other according to a column pitch that may be too small to accommodate a sense amplifier. It is thus traditional that the columns are arranged into multiplexed groups, with each group being multiplexed by a corresponding read column multiplexer and a corresponding write column multiplexer. The number of columns multiplexed by each read column multiplexer (MUX) and each write column multiplexer depends upon the implementation. For example, in a "MUX2" memory, each column multiplexer selects from a group of two columns. Similarly, each column multiplexer selects from a group of four columns in a "MUX4" memory, and so on. For simplicity, the following discussion will be directed to a "MUX2" implementation in which each column multiplexer selects from a group of two columns. However, it will be appreciated that other magnitudes of column multiplexing may be used in alternative implementations of the enhanced serial read write memories disclosed herein.

As used herein, a "serial read write memory" is defined as a memory in which a read operation to a bank may be followed by a write operation to the bank during a single memory clock cycle. During the read operation to a bank, a voltage difference develops across the bit line pair in each column. Prior to the write operation, it is thus traditional for a serial read write memory to perform a bit line pre-charge to pre-charge the bit lines to a memory power supply voltage. The pre-charge operation between the read and write operations may also be denoted as a cleanup operation since is "cleans up" the bit line voltage differences. In the write operation to a bank, each write column multiplexer selects for a column. The selected column is denoted herein as a write-selected column. The remaining columns in each group of multiplexed columns are denoted as write-unselected columns. During the write operation, a bit line in the selected column is discharged while the remaining bit line for the selected column remains charged to the memory power supply voltage. With the discharge completed, the discharge is maintained for a sufficient amount of time denoted as a write margin so that the accessed bitcell may be written to.

Should a read operation occur to a multiplexed group of columns in a bank followed by a write operation to the multiplexed group of columns during a memory clock cycle, the advantageous enhanced serial read write memories disclosed herein do not pre-charge the bit lines in the write-selected column following the read operation. Instead, the write operation may begin during what would have been the cleanup operation. In the write operation, one of the bit lines will be discharged in the write-selected column. Should the read operation have already partially discharged that bit line, no charge is spent pre-charging the bit line back to the memory power supply voltage only to then discharge it during the write operation. Moreover, even if the binary value to be written is such that the partially-discharged bit line must be charged to the memory power supply voltage during the write operation, the net effect is not only a power consumption reduction but also an increase in operating speed since the write operation is beginning during what would have been the cleanup operation in a traditional serial read write memory.

To provide a better appreciation of the advantages of the enhanced serial read write memories disclosed herein, an example multiplexed group of columns 100 for a bank in a traditional serial read write memory is shown in FIG. 1. Some example read and write operating waveforms 200 for the multiplexed group of columns 100 will also be discussed with reference to FIG. 2. It will be appreciated that a bank includes a plurality of such multiplexed groups of columns but just one multiplexed group of columns 100 is shown in FIG. 1 for illustration clarity. In this example, the memory is a "MUX2" memory in which the multiplexed group of columns 100 includes just two columns. A bit line bl<0> and its complement blb<0> traverses a zeroth column of bitcells. Similarly, a bit line bl<1> and its complement blb<1> traverses a first column of bitcells.

The bitcells in the multiplexed group of columns 100 are arranged into N rows, where N is a plural positive integer. For illustration clarity, only a zeroth row and an (N−1)th row are shown in FIG. 1. A corresponding word line (WL) traverses each row. For example, a zeroth word line WL<0> traverses the zeroth row of bitcells whereas an (N−1)th word line WL<N−1> traverses the (N−1)th row of bitcells. During a read operation, a read column multiplexer (not shown for illustration clarity) selects a column from the multiplexed group of columns. The read operation begins at a time t0 in response to an assertion of a memory clock signal 205. In turn, the assertion of the memory clock signal triggers an assertion of a word line voltage (WL 210) during the read operation. With regard to a subsequent write operation in the same memory clock cycle, recall that one of the columns is denoted as a write-selected column in that it is selected for by a write column multiplexer 105 (FIG. 1) during the write operation. The remaining column is denoted as a write-unselected column as it is not written to during the write operation.

The read operation may be to either the write-selected column or the write-unselected column. Prior to the read operation beginning at time t0, the bit lines for the columns in the multiplexed group of columns 100 are precharged to a memory power supply voltage VDD. A bit line precharge signal BL PRE controls whether a precharge circuit 110 precharges the bit lines for the zeroth column. Similarly, the same bit line precharge signal BL PRE controls whether a precharge circuit 115 precharges the bit lines for the first column. As defined herein, a binary signal is deemed to be asserted when the binary signal is true, regardless of whether the true state is represented by an active-high or an active-low convention. In an active-low convention, a signal is thus asserted by being discharged to ground. Conversely, a signal is asserted by being charged to a power supply voltage in an active-high convention.

Figure 2:
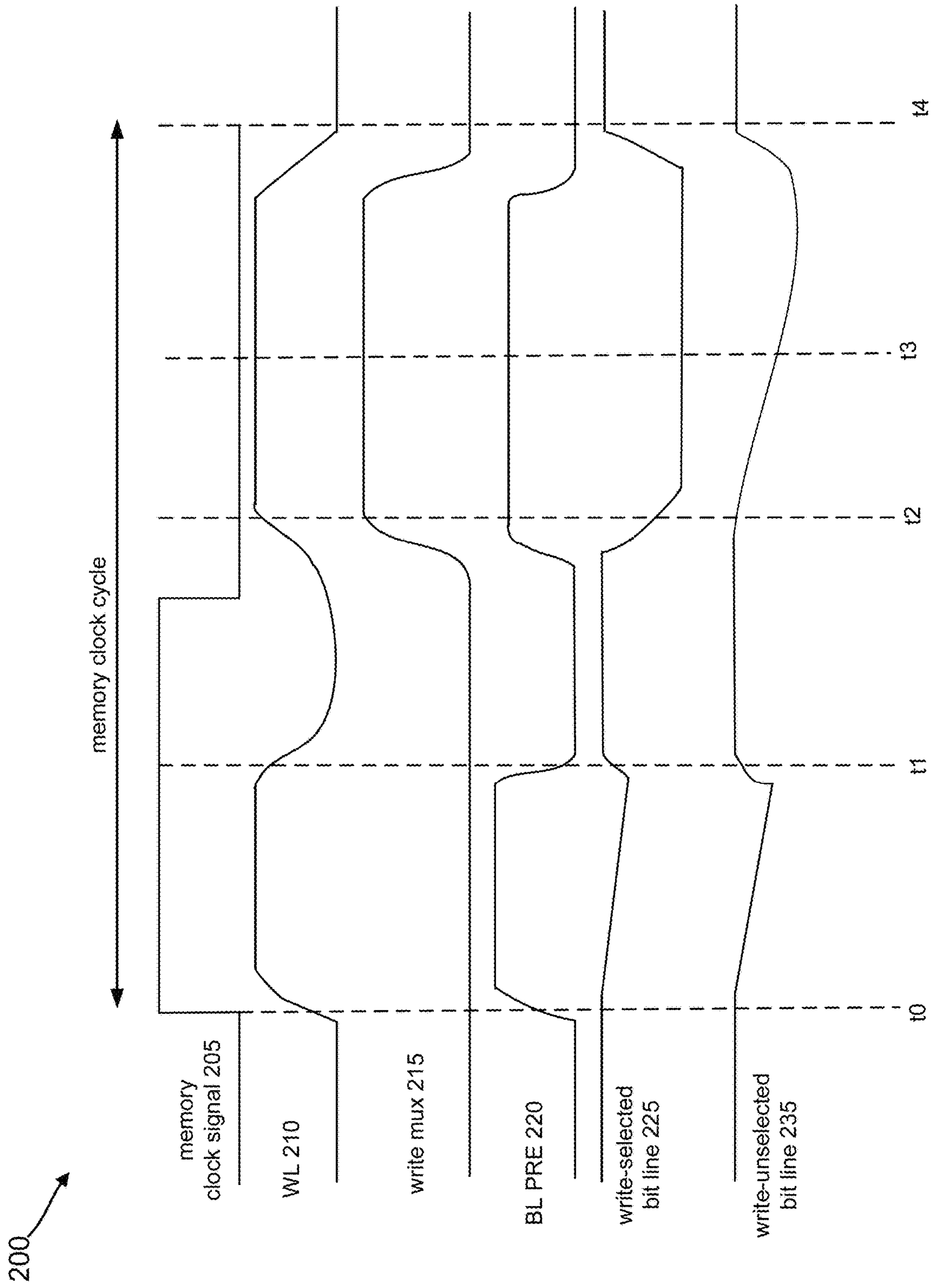
FIG. 2 is a diagram of some read and write operating waveforms for a traditional multiplexed group of columns.

As shown in FIG. 2, the bit line precharge signal BL PRE 220 is asserted by being discharged prior to the read operation beginning at a time t. At time t0, the bit line precharge signal BL PRE 220 is released (de-asserted) by being charged to the memory power supply voltage. In this fashion, the precharge does not interfere with the read operation. While the word line voltage 210 is asserted during the read operation from time t0 to a time t1, a voltage difference develops across the bit line pairs in each column that intersects with the word line, regardless of whether the column is selected or not. For illustration clarity, just one bit line voltage (a write-selected bit line voltage 225) is shown for the write-selected column. Similarly, just one bit line voltage (a write-unselected bit line voltage 235) is shown for the write-unselected column. In this example, the binary value of the accessed bitcell for the write-selected column and the accessed bitcell for the write-unselected column is such that both the write-selected bit line voltage 225 and the write-unselected bit line voltage 235 decline during the read operation. At the conclusion of the read operation at time t1, a cleanup operation occurs from time t1 to a time t2. During the cleanup operation, the word line voltage 210 is released and the bit line precharge signal BL PRE 220 is again asserted by being discharged to ground. The write-selected bit line voltage 225 and the write-unselected bit line voltage 235 are thus precharged back to the memory power supply voltage during the cleanup operation.

Referring again to FIG. 1, the write column multiplexer (mux) 105 responds to an assertion of a write mux 1 signal by selecting for the first column. Similarly, the write column multiplexer 105 responds to an assertion of a write mux 0 signal by selecting for the zeroth column. Should the zeroth column be selected for, the write column multiplexer 105 couples a write driver (WD) node to the zeroth bit line bl<0>. Similarly, the write column multiplexer 105 couples a complement write driver (WDB) node to the complement zeroth bit line blb<0> in response to the assertion of the write mux 0 signal. Should the write mux 1 signal be asserted, the write column multiplexer 105 instead couples the WD node to the first bit line bl<1> and couples the WDB node the complement first bit line blb<1>.

The asserted write mux signal is denoted as a write mux signal 215 in FIG. 2. At time t2, the write operation begins with the re-assertion of the word line voltage 210. At the same time, the write mux signal 215 is asserted so that the write column multiplexer 105 may select for the write-selected column. In this example, the binary value of the bit being written to the write-selected column is such that the write-selected bit line voltage 225 discharges to ground before a time t3. The write operation continues to a time t4, at which point the memory clock signal 205 may begin a new cycle (not illustrated). The write operation thus includes a write bit line discharge period that occurs from time t2 to time t3 and includes a write margin period that extends from time t3 to time t4. Referring again to FIG. 1, a write driver for the multiplexed group of columns 100 includes an n-type metal-oxide semiconductor (NMOS) M1 having a drain coupled to the WD node and a source coupled to ground. Similarly, the write driver also includes an NMOS transistor M2 having a drain coupled to the WDB node and a source coupled to ground. A write 0 signal controls the gate of transistor M1.

Should the write 0 signal be asserted during the write operation, transistor M1 is switched on to discharge the WD node and thus discharge the bit line of the write-selected column. A write 1 signal that is the complement of the write 0 signal controls the gate of the transistor M2. Should the write 0 signal be asserted during the write operation, transistor M2 will thus stay off, isolating the WDB node and the complement bit line of the write-selected column from ground. The assertion of the write 0 signal thus discharges the bit line and maintains the precharge of the complement bit line so as to write a binary zero to the selected bitcell in the write-selected column. Conversely, an assertion of the write 1 signal during the write operation causes the complement bit line to be discharged and maintains the precharge of the bit line so as to write a binary one to the selected bitcell in the write-selected column.

The cleanup operation discussed from time t1 to time t2 to the write-selected column is eliminated in the enhanced serial read write memories disclosed herein. Instead, the cleanup occurs only to the write-unselected columns. In that regard, note how the write-selected bit line voltage 225 was already in a partially-discharged state (partially discharged from the memory power supply voltage) prior to time t1. Should the binary value being written in the write operation also require the write-selected bit line voltage 225 to be discharged to ground, it may readily be appreciated that power consumption is reduced by not performing a cleanup operation only to then have to discharge the write-selected bit line voltage 225 again. Even if the binary value being written is such that the write-selected bit line voltage 225 must be charged to the memory power supply voltage, note that the complement bit line for the write-selected column would then have started to discharge during the read operation. The complement bit line would then be fully discharged during the write operation without an intervening precharge. It will thus be appreciated that one of the bit lines (either the bit line or its complement) for the write-selected column will already be partially discharged from the read operation and then fully discharged during the subsequent write operation without the need for an intervening precharge. The elimination of the cleanup operation to the write-selected column thus saves substantial power.

Although a cleanup operation occurs to the write-unselected column (or write-unselected columns for implementations with the number of multiplexed columns being greater than two), note that the memory speed is still enhanced since this cleanup operation may occur in parallel with the write operation to the write-selected column. In contrast, the write operation for the write-selected column cannot start until the cleanup operation is finished in a traditional memory. Since the cleanup operation takes time, the write operation speed for a traditional serial read write memory is increased by increasing the size of the write driver transistors (e.g., transistors M1 and M2 discussed earlier) and/or by decreasing their threshold voltages. But this increased write operation speed then comes at the cost of increased leakage through the write driver transistors. The enhanced serial read write memories disclosed herein may use relatively smaller write driver transistors so as to reduce leakage and thus reduce power consumption. These relatively-small write driver transistors are adequate due to the time-savings of simultaneously performing the cleanup to the write-unselected column(s) while writing to the write-selected column. Some example enhanced serial read write memories will now be discussed in more detail.

Figure 3:
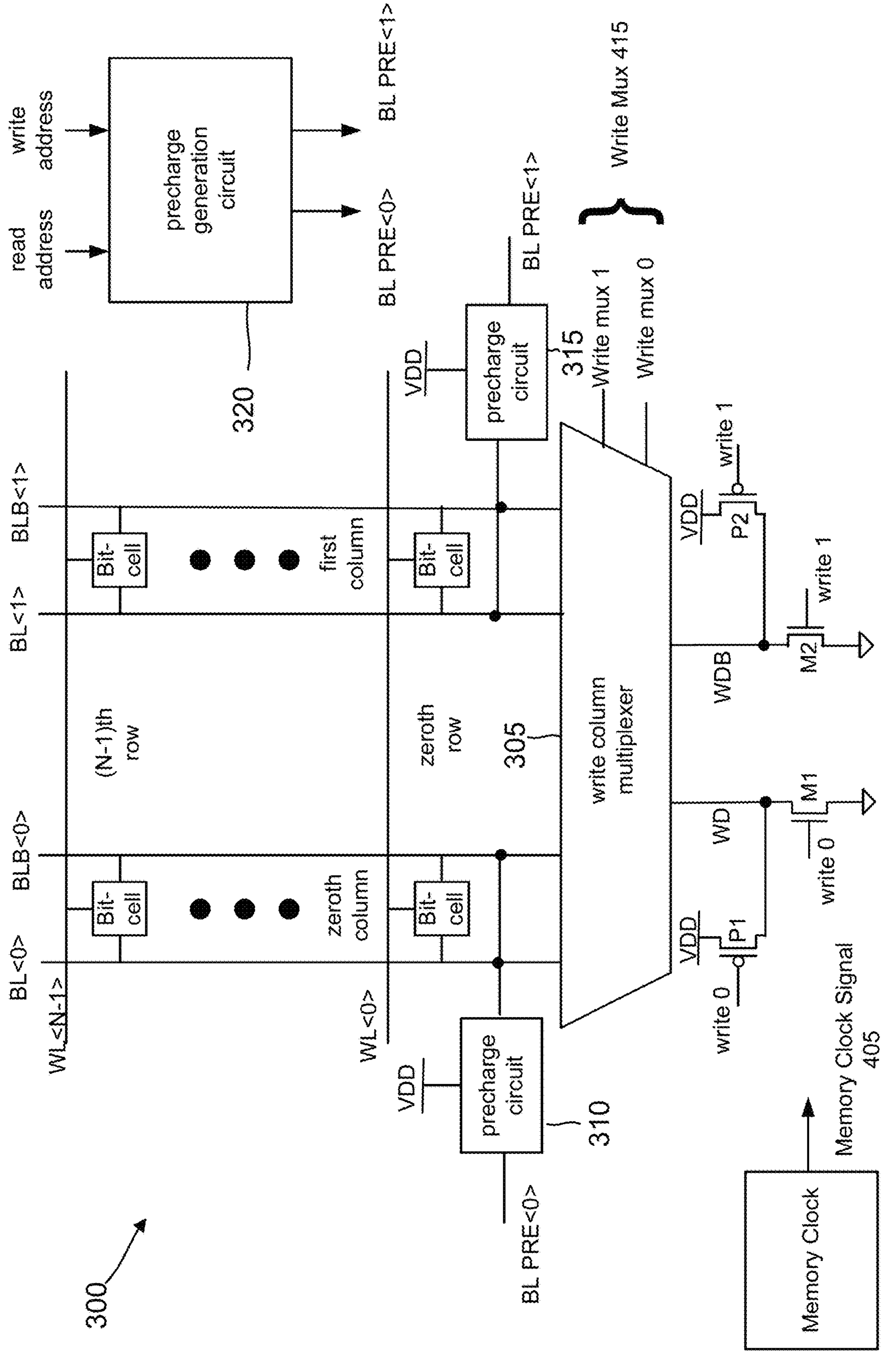
FIG. 3 is a circuit diagram of a bank including a multiplexed group of columns in accordance with an aspect of the disclosure.

An example multiplexed group of columns 300 for a bank in an enhanced serial read write memory is shown in FIG. 3. Some example read and write operating waveforms 400 for the multiplexed group of columns 300 will also be discussed with reference to FIG. 4. It will be appreciated that a memory bank in the enhanced serial read write memory may include a plurality of such multiplexed group of columns but just one multiplexed group of columns 300 is shown in FIG. 3 for illustration clarity. In this example, the memory is a "MUX2" memory in which the multiplexed group of columns 300 includes just two columns. However, it will be appreciated that a greater number of columns (e.g., 4 or 8) may be used in alternative implementations. A bit line bl<0> and its complement blb<0> traverses a zeroth column of bitcells. Similarly, a bit line bl<1> and its complement blb<1> traverses a first column of bitcells. A write column multiplexer 305 selects for a write-selected one of the columns during a write operation. The write column multiplexer 305 responds to an assertion of a write mux 1 signal to select for the first column in the write operation. Conversely, the write column multiplexer 305 responds to an assertion of a write mux 0 signal to select for the zeroth column during the write operation. Should the zeroth column be selected for, the write column multiplexer 305 couples a write driver (WD) node to the zeroth bit line bl<0>. Similarly, the write column multiplexer 305 couples a complement write driver (WDB) node to the complement zeroth bit line blb<0> in response to the assertion of the write mux 0 signal. Should the write mux 1 signal be asserted, the write column multiplexer 105 instead couples the WD node to the first bit line bl<1> and couples the WDB node the complement first bit line blb<1>.

Since the cleanup operation occurs only to the write-unselected column (or write-unselected columns in a MUX4 or greater implementation), there is a separate pre-charge signal for each column. For example, a zeroth bit line precharge signal BL PRE<0> controls whether a precharge circuit 310 precharges the bit lines for the zeroth column. Similarly, a first bit line precharge signal BL PRE<1> controls whether a precharge circuit 315 precharges the bit lines for the first column. Both of these precharge signals may be active-low signals. As discussed earlier, a binary signal is deemed to be asserted herein when the binary signal is true, regardless of whether the true state is represented by an active-high or an active-low convention. In an active-low convention, a binary signal is thus asserted by being discharged to ground. Conversely, a binary signal is asserted by being charged to a power supply voltage in an active-high convention.

The bitcells in the multiplexed group of columns 300 are arranged into N rows, where N is a plural positive integer. For illustration clarity, only a zeroth row and an (N−1)th row are shown in FIG. 3. A corresponding word line (WL) traverses each row. For example, a zeroth word line WL<0> traverses the zeroth row of bitcells whereas an (N−1)th word line WL<N−1> traverses the (N−1)th row of bitcells. During a read operation, a read multiplexer (not shown for illustration clarity) selects a column from the multiplexed group of columns.

Figure 4:
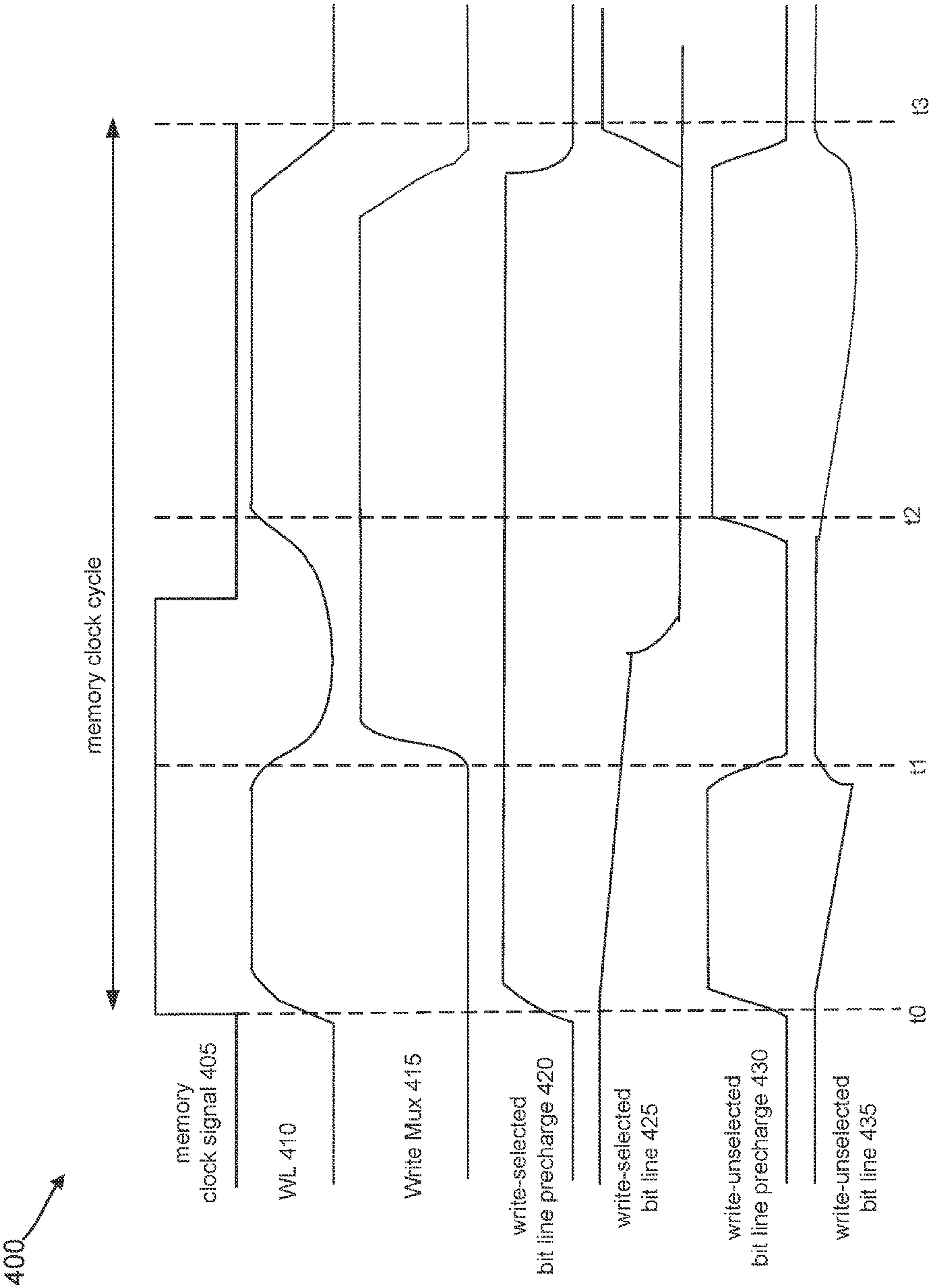
FIG. 4 is a diagram of some read and write operating waveforms for a multiplexed group of columns in accordance with an aspect of the disclosure.

Prior to the read operation beginning at time t0, the bit lines for the columns in the multiplexed group of columns 300 are precharged to a memory power supply voltage VDD. Depending upon which column is the write-selected column, one of the precharge signals may also be denoted as a write-selected bit line precharge signal 420 whereas the precharge signal for the write-unselected column may be denoted as a write-unselected bit line precharge signal 430 as shown in FIG. 4. As also shown in FIG. 4, the read operation begins at a time t0 in response to an assertion of a memory clock signal 405. Prior to the read operation beginning at time t0, both the write-selected bit line precharge signal 420 and the write-unselected bit line precharge signal 430 are asserted by being discharged so that the bit lines in the multiplexed group of columns 300 are charged to the memory power supply voltage. At time t0, the write-selected bit line precharge signal 420 and the write-unselected bit line precharge signal 430 are both released (de-asserted) by being charged to the memory power supply voltage. In this fashion, the precharge does not interfere with the read operation. In turn, the assertion of the memory clock signal triggers an assertion of a word line voltage (WL 410) for the addressed one of the word lines during the read.

The read operation may be to either the write-selected column or the write-unselected column. While the word line voltage 410 is asserted during the read operation from time t0 to a time t1, a voltage difference develops across the bit line pairs in each column that intersects with the word line, regardless of whether the column is selected or not. For illustration clarity, just one bit line voltage (a write-selected bit line voltage 425) is shown for the write-selected column. Similarly, just one bit line voltage (a write-unselected bit line voltage 435) is shown for the write-unselected column. In this example, the binary value stored in the accessed bitcell for the write-selected column and stored in the accessed bitcell for the write-unselected column is such that both the write-selected bit line voltage 425 and the write-unselected bit line voltage 435 decline during the read operation. Should the accessed bitcell be storing a complement of this binary value, then the write-selected bit line voltage 425 and the write-unselected bit line voltage 435 would both substantially remain charged to the memory power supply during the read operation. Note that at the conclusion of the read operation at time t1, there is no cleanup operation for the write-selected column. Instead, the write operation begins at time t1 with the assertion of a write mux signal 415. Depending upon which column is the write-selected column, the write mux signal 415 may be one of the write mux 1 or 0 signals discussed earlier.

A cleanup operation for the write-unselected column begins at time t1 with the assertion of the write-unselected bit line precharge signal 430 (recall that the bit line precharge signals in one implementation are active-low such that they are asserted by being discharged). During the cleanup operation, the word line voltage 410 is released. The write-unselected bit line voltage 435 is thus precharged back to the memory power supply voltage during the cleanup operation.

Prior to or approximate with time t2, the word line voltage 410 is again asserted. Although FIG. 4 implies that the same word line is asserted in both the read and write operations, note that the advantageous lack of a cleanup operation for the write-selected column may occur so long as the serial read and write operations occur to the same multiplexed group of columns in a bank. Thus, the assertion of the word line voltage 410 after time t1 in FIG. 4 may be for a different word line in the bank as compared to the word line voltage occurring at time t0. At time t2, the word line voltage 410 is fully asserted. At the same time, the write-unselected bit line precharge signal 430 is released by being charged back to the memory power supply voltage to release the precharge for the write-unselected column.

With regard to the write operation to the write-selected column, note that it may be the case that the binary value being written is such that the write-selected bit line voltage 425 is fully discharged after time t1. It may readily be appreciated that a considerable amount of power was saved by not first cleaning up the write-selected bit line voltage 425 in that scenario since the read operation resulted in the write-selected bit line voltage 425 being partially discharged. Alternatively, it may be the case that the binary value being written is such that the write-selected bit line voltage 425 must be charged to the memory power supply voltage during the read operation. Since there is no assertion of the write-selected bit line precharge voltage 420 between the serial read and write operations, the write driver itself performs this bit line charging.

Referring again to FIG. 3, the bit line charging by the write driver will now be discussed. Note that the WD node couples to a drain of a p-type metal-oxide semiconductor (PMOS) transistor P1 that in turn has a source coupled to a node for the memory power supply voltage (VDD). The WD node also couples to the drain of the transistor M1 as discussed for the write driver of FIG. 1. A source of transistor M1 couples to ground. The write 0 signal drives the gate of both the write driver transistors P1 and M1. Similarly, the WDB node couples to a drain of a p-type metal-oxide semiconductor (PMOS) transistor P2 that in turn has a source coupled to the node for the memory power supply voltage (VDD). The WDB node also couples to the drain of the transistor M2 as discussed for the write driver of FIG. 1. A source of transistor M2 couples to ground. The write 1 signal drives the gate of both the write driver transistors P2 and M2.

Suppose that a binary 1 is to be written to the accessed bitcell during the write operation. In that case, the write 1 signal is asserted by being charged to the memory power supply voltage whereas the write 0 signal is de-asserted by being discharged to ground. The discharge of the write 0 signal switches on transistor P1 to cause the bit line in the write-selected column to be charged to the memory power supply voltage. Conversely, the assertion of the write 1 signal switches on transistor M2 to cause the complement bit line in the write-selected column to be discharged to ground. Should a binary 0 instead be written to the accessed bitcell during the write operation, the write 0 signal is asserted by being charged to the memory power supply voltage whereas the write 1 signal is de-asserted by being discharged to ground. The discharge of the write 1 signal switches on transistor P2 to cause the complement bit line in the write-selected column to be charged to the memory power supply voltage. Conversely, the assertion of the write 0 signal switches on transistor M1 to cause the bit line in the write-selected column to be discharged to ground.

Regardless of whether a binary 1 or a binary 0 is to be written during the write operation, note that 50% of the time this binary value will equal the binary value being read during the preceding read operation. In that case, either the bit line or the complement bit line voltage will behave as shown for the write-selected bit line voltage 425: the voltage decline that began during the read operation to a partially-discharged state is then accelerated during the write operation beginning after time t1 so that the partially-discharged state becomes a fully-discharged-to-ground state. It may readily be appreciated that it saves a considerable amount of power to not cleanup such a bit line voltage between the read and write operations. Even if the bit line voltage must be recharged through the write driver as discussed with regard to transistors P1 and P2, note that the write operation speed is increased since the write operation may begin with the assertion of the write mux signal 415 at time t1.

At time t2, the word line voltage 410 is again asserted for the write operation. From time t1 to just prior to a time t3, the write mux signal 415 and the word line voltage 410 continue to be asserted to provide a sufficient write margin to the write operation. At time t3, the word line voltage 410, the write mux signal 415, and the write-unselected bit line precharge signal 430 are all released. Time t3 is also the end of the clock cycle for the memory clock signal 415. The write-selected bit line precharge voltage 420 remains released from time t0 to just before time t3. As compared to the traditional memory, the enhanced serial read write memory results in a shorter memory clock cycle and thus a faster serial read write cycle because of the write operation to the write-selected column beginning in parallel with the cleanup to the write-unselected column at time t1.

Figure 5:
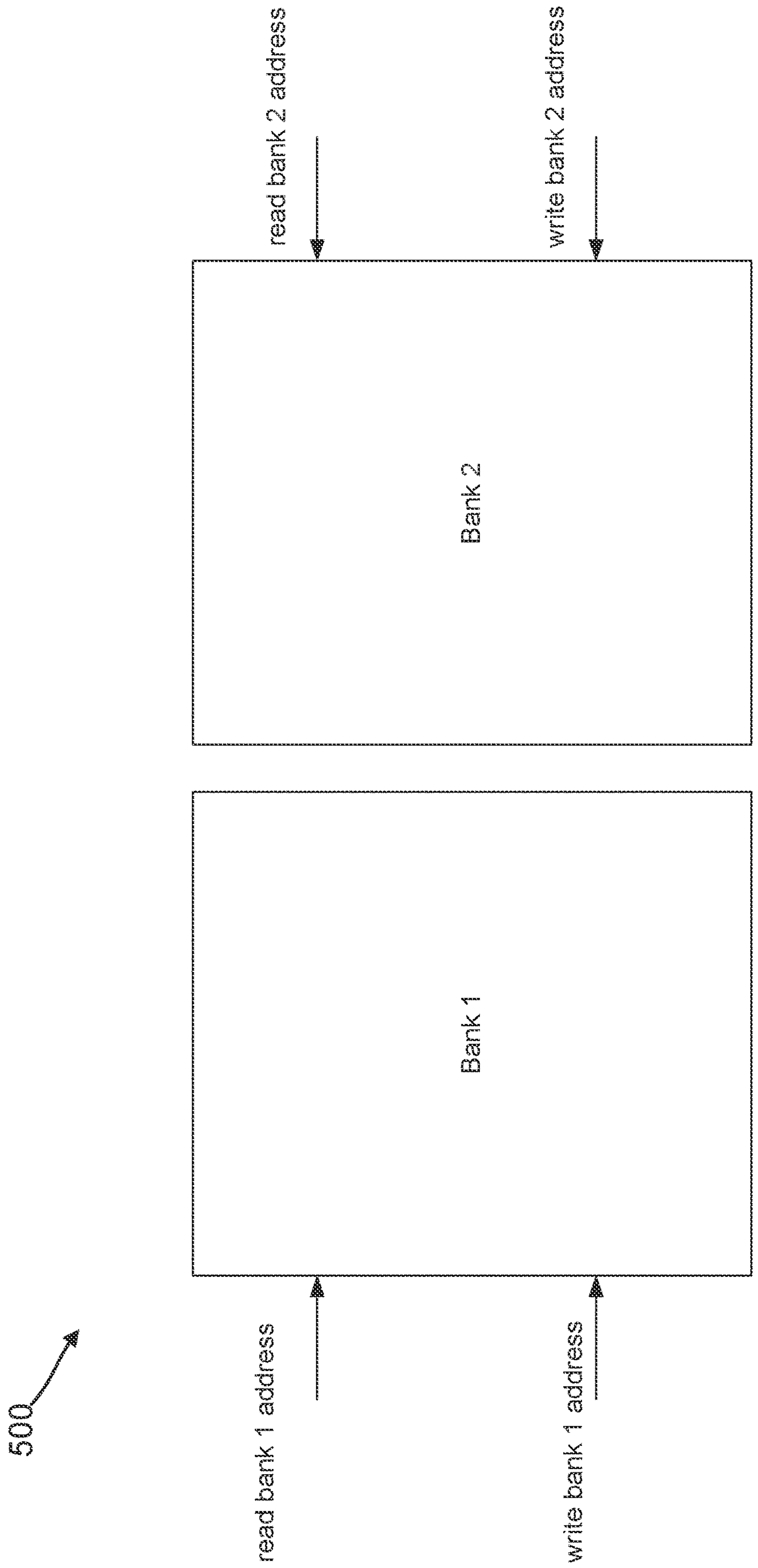
FIG. 5 is a diagram of a multi-bank memory in accordance with an aspect of the disclosure.

An enhanced serial read write memory 500 with a first bank (Bank 1) and a second bank (Bank 2) of bitcells is shown in FIG. 5. Note that in any given memory clock cycle, a read operation may occur to one of the banks but the write operation may be to the other bank. In that regard, a read bank 1 address signal controls whether a read operation is directed to a multiplexed group of columns in the first bank during a memory clock cycle. Similarly, a write bank 1 address signal controls whether a write operation is directed to the multiplexed group of columns in the first bank during the memory clock cycle. The control of the second bank is analogous. In particular, a read bank 2 address signal controls whether a read operation is directed to a multiplexed group of columns in the second bank during a memory clock cycle. Similarly, a write bank 2 address signal controls whether a write operation is directed to the multiplexed group of columns in the second bank during the memory clock cycle.

It may thus be the case that a read operation occurs to a multiplexed column group in a bank during a memory clock cycle but the write operation in the memory clock cycle is not directed to the same multiplexed group of columns and bank. Referring again to FIG. 3, a precharge generation circuit 320 is configured to sample the write address during a read operation to determine whether the write operation will be directed to the same bank and multiplexed group of columns. Should the read (as determined through a read address) and write be directed to the same bank and multiplexed column group, the precharge generation circuit latches the write-unselected bit line precharge signal so that it may be applied to the write operation. Should the read and write addresses indicate that the write operation is to a different bank and/or different column multiplexed group, the precharge signals for the write operation are generated as shown for the write portion discussed for FIG. 4.

Figure 6:
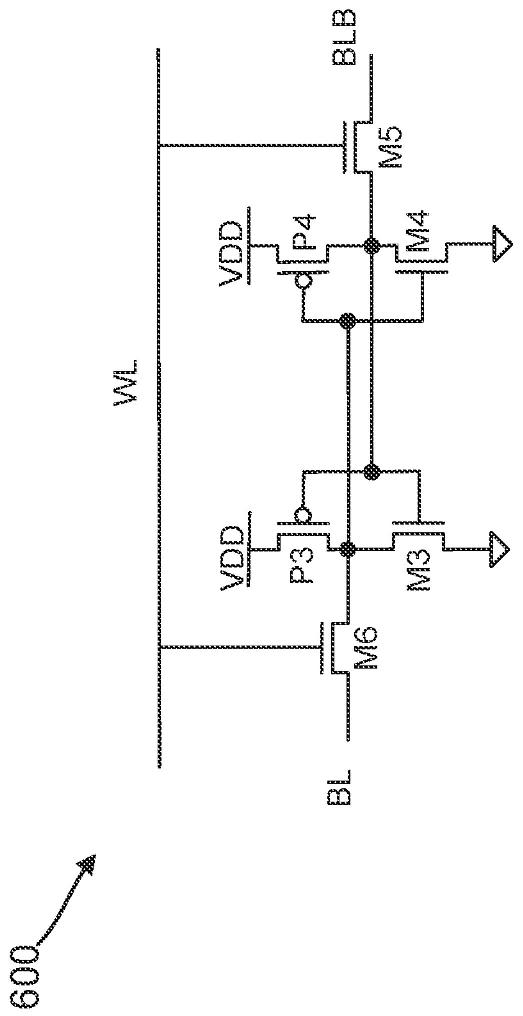
FIG. 6 is a circuit diagram of a six-transistor bitcell for an enhanced serial read write memory in accordance with an aspect of the disclosure.

The enhanced serial read write memories disclosed herein may be pseudo-dual-port static-random-access memories. An example six-transistor bitcell 600 for an example pseudo-dual-port static-random-access memory (SRAM) is shown in FIG. 6. A first inverter in a pair of cross-coupled inverters is formed by a serial stack of a PMOS transistor P3 and an NMOS transistor M3. Similarly, a second inverter is formed by a serial stack of a PMOS transistor P4 and an NMOS transistor M4. The drains of transistors P3 and M3 form a true output node Q for the bitcell 600. Similarly, the drains of transistor P4 and M4 form a complement output node QB. An NMOS access transistor M6 couples between the Q output node and a bit line BL. Similarly, an NMOS access transistor M5 couples between the QB output node and complement bit line BLB. A word line WL couples to the gate of the access transistors M5 and M6. When the word line voltage is asserted during a read operation (e.g., from time t0 to t1 of FIG. 4), the access transistors switch on to couple the Q output node to the bit line and to couple the QB output node to the complement bit line. The bit lines thus function as a read port at this time. When the word line voltage is again asserted during write operation (such as from time t1 to time t3 of FIG. 4), the access transistors again switch on so that the bit line pair functions as a pseudo-separate write port as compared to the read port.

Figure 7:
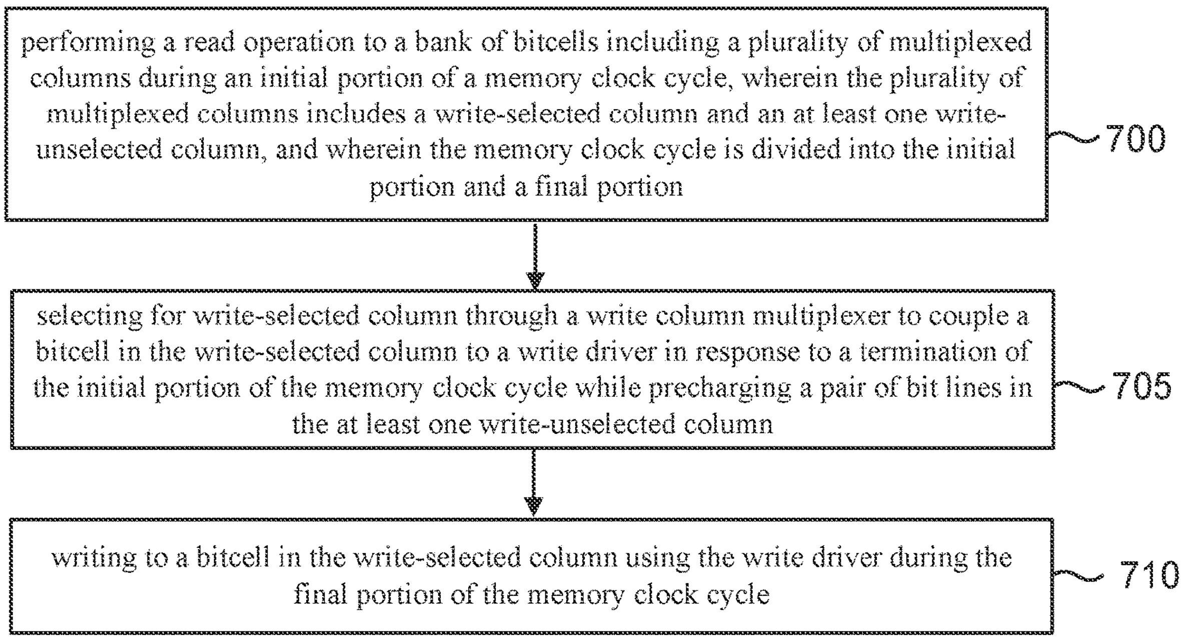
FIG. 7 is a flowchart for a method of operation for an enhanced serial read write memory in accordance with an aspect of the disclosure.

An example method of operation for an enhanced serial read write memory will now be discussed with reference to the flowchart of FIG. 7. The method includes an act 700 of performing a read operation to a bank of bitcells including a plurality of multiplexed columns during an initial portion (which may also be denoted as a first portion) of a memory clock cycle, wherein the plurality of multiplexed columns includes a write-selected column and an at least one write-unselected column, and wherein the memory clock cycle is divided into the initial portion and a final portion (which may also be denoted as a second portion). The read operation occurring from time t0 to t1 is an example of act 700. The final portion of the memory clock cycle would thus extend from time t1 to time t3. The method also includes an act 705 of selecting for the write-selected column through a write column multiplexer to couple a bitcell in the write-selected column to a write driver in response to a termination of the initial portion of the memory clock cycle while precharging a pair of bit lines in the at least one write-unselected column. The selection of the write-selected column by column multiplexer 305 in response to the assertion of the write mux signal 415 at time t1 while also asserting the write-unselected bit line precharge signal 430 is an example of act 705. Finally, the method includes an act 710 of writing to a bitcell in the write-selected column using the write driver during the final portion of the memory clock cycle. The operation of the write driver transistors P1, P2, M1, and M2 discussed with regard to FIG. 3 while the write mux signal 415 and the word line voltage 410 are asserted from time t1 to approximately time t3 is an example of act 710.

Figure 8:
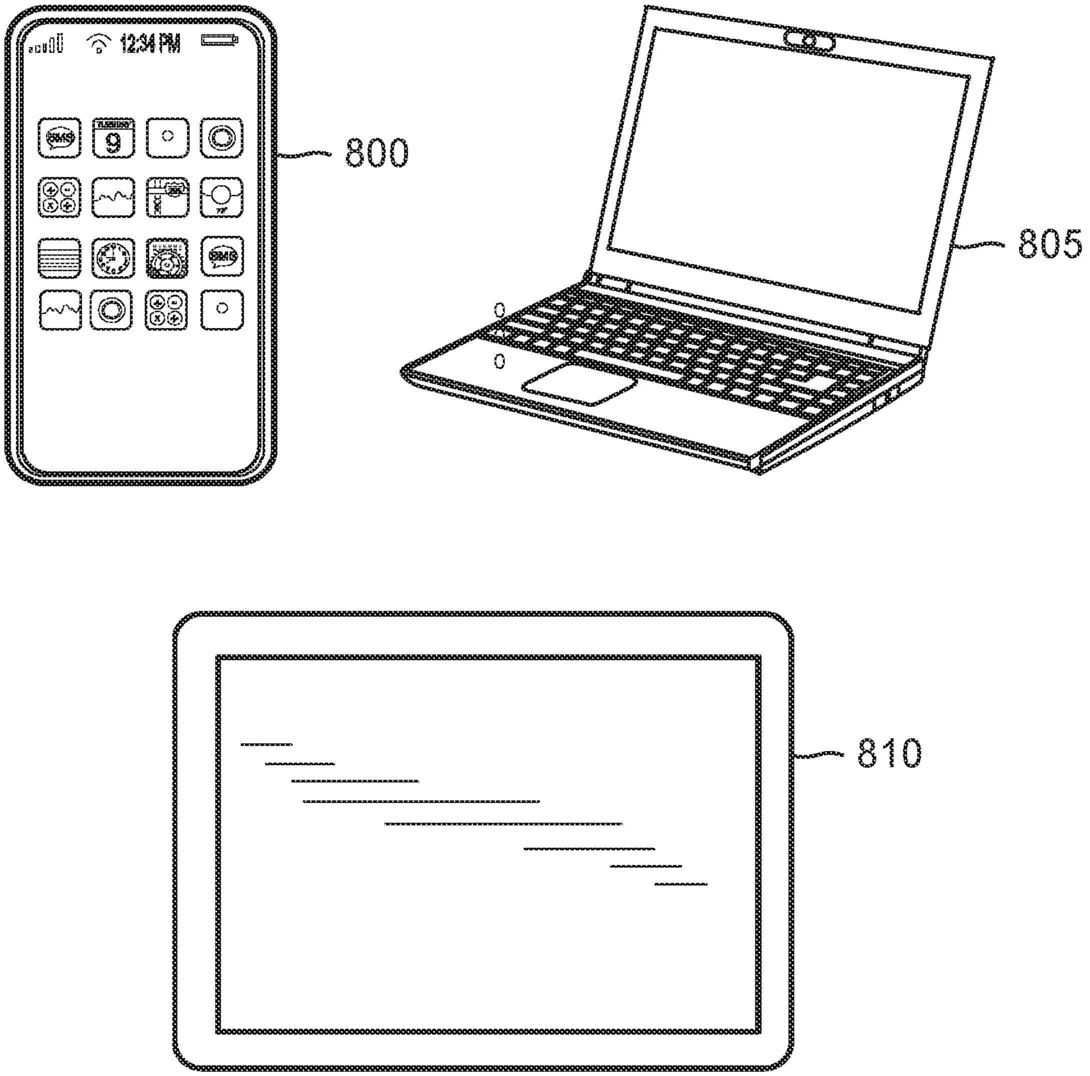
FIG. 8 illustrates some example electronic systems including an enhanced serial read write memory in accordance with an aspect of the disclosure.

An enhanced serial read write memory may as disclosed herein may be incorporated in a wide variety of electronic systems. For example, as shown in FIG. 8, a cellular telephone 800, a laptop computer 805, and a tablet PC 810 may all include an enhanced serial read write memory in accordance with the disclosure. Other exemplary electronic systems such as a music player, a video player, a communication device, and a personal computer may also be configured with an enhanced serial read write memory constructed in accordance with the disclosure.

Some example implementations are described by the following numbered clauses:

Clause 1. A serial read write memory comprising:
- a bank of bitcells arranged into a plurality of columns, wherein the plurality of columns includes a multiplexed group of columns;
- a write column multiplexer configured to select for a write-selected column from the multiplexed group of columns during a write operation, wherein the multiplexed group of columns includes a write-unselected column;
- a first precharge circuit configured to charge a first pair of bit lines in the write-selected column to a memory power supply voltage responsive to an assertion of a first bit line precharge signal; and
- a second precharge circuit configured to charge a second pair of bit lines in the write-unselected column to the memory power supply voltage responsive to an assertion of a second bit line precharge signal.

Clause 2. The serial read write memory of clause 1, further comprising:
- a precharge generation circuit configured to assert the second bit line precharge signal during the write operation while the first bit line precharge signal remains de-asserted responsive to a read operation occurring to the bank of bitcells during an initial portion of a memory clock cycle, wherein the memory clock cycle is divided into the initial portion and a final portion, and wherein the write operation occurs during the final portion.

Clause 3. The serial read write memory of any of clauses 1-2, further comprising:
- a write driver configured to charge a first bit line in the first pair of bit lines during the write operation and configured to discharge a second bit line in the first pair of bit lines during the write operation.

Clause 4. The serial read write memory of clause 3, wherein the write column multiplexer is configured to couple the first bit line to a first write driver node during the write operation and to couple the second bit line to a second write driver node during the write operation, and wherein the write driver comprises:
- a first transistor coupled between the first write driver node and ground;
- a second transistor coupled between the first write driver node and a node for the memory power supply voltage;
- a third transistor coupled between the second write driver node and ground; and
- a fourth transistor coupled between the second write driver node and the node for the memory power supply voltage.

Clause 5. The serial read write memory of any of clauses 1-4, wherein each bitcell comprises a six-transistor static-random-access memory bitcell.

Clause 6. The serial read write memory of clause 2, wherein the bank of bitcells are further arranged into rows, with each row traversed by a corresponding word line, and wherein the serial read write memory is further configured to charge a first word line during the read operation and to charge a second word line during the write operation.

Clause 7. The serial read write memory of any of clauses 1-6, wherein the write-unselected column comprises a plurality of write-unselected columns.

Clause 8. The serial read write memory of clause 2, wherein the precharge generation circuit is further configured to latch the second bit line precharge signal during the read operation.

Clause 9. The serial read write memory of clause 1, wherein the multiplexed group of columns includes only two columns.

Clause 10. The serial read write memory of clause 2, wherein the first bit line precharge signal and the second bit line precharge signal are both active-low signals, and wherein the precharge generation circuit is further configured to assert the second bit line precharge signal by a discharge of the second bit line precharge signal to ground.

Clause 11. The serial read write memory of any of clauses 1-10, wherein the serial read write memory is included within a cellular telephone.

Clause 12. A method of operation for a serial read write memory, comprising:
- performing a read operation to a multiplexed group of columns during a first portion of a memory clock cycle, wherein the multiplexed group of columns includes a write-selected column and an at least one write-unselected column, and wherein the memory clock cycle is divided into the first portion and a second portion;
- selecting for the write-selected column through a write column multiplexer to couple a bitcell in the write-selected column to a write driver in response to a termination of the first portion of the memory clock cycle while precharging a pair of bit lines in the at least one write-unselected column; and
- writing to a bitcell in the write-selected column using the write driver during the second portion of the memory clock cycle.

Clause 13. The method of clause 12, wherein a pair of bit lines in the write-selected column are precharged prior to the read operation and are not precharged during the memory clock cycle.

Clause 14. The method of clause 13, wherein a first bit line in the pair of bit lines in the write-selected column discharges to a partially-discharged state during the read operation, and wherein the write driver discharges the first bit line from the partially-discharged state to a fully-discharged state during the second portion of the memory clock cycle.

Clause 15. The method of any of clauses 12-13, further comprising:

asserting a word line voltage during the read operation; and asserting the word line voltage during the writing to the bitcell in the write-selected column.

Clause 16. A pseudo-dual-port memory, comprising:

a bank of bitcells arranged into a plurality of columns and into a plurality of rows, wherein the pseudo-dual-port memory is configured to assert a word line voltage for one of the rows during a read operation to the bank of bitcells in a first portion of a memory clock cycle and to assert the word line voltage during a write operation to a write-selected column in the plurality of columns in a second portion of the memory clock cycle; and a precharge generation circuit configured to control a precharge of each column prior to the read operation and to prevent a precharge of the write-selected column during the memory clock cycle.

Clause 17. The pseudo-dual-port memory of clause 16, further comprising:

a write multiplexer configured to select for the write-selected column during the write operation, wherein the write-selected column is included within a multiplexed group of columns from the plurality of columns.

Clause 18. The pseudo-dual-port memory of clause 17, further comprising:

a write driver configured to couple a first bit line from a pair of bit lines in the write-selected column to a node for a memory power supply voltage during the write operation and configured to couple a second bit line from the pair of bit lines in the write-selected column to ground during the write operation.

Clause 19. A method of operation for a serial read write operation, comprising:

discharging a first bit line in a write-selected column from a pre-charged state to a partially-discharged state during a read operation in a first portion of a memory clock cycle; and fully discharging the first bit line from the partially-discharged state to ground during a write operation in a second portion of the memory clock cycle.

Clause 20. The method of operation of clause 19, further comprising:

precharging a second bit line in a write-unselected column while fully discharging the first bit line, wherein the write-selected column is included within a group of multiplexed columns including the write-unselected column.

Clause 21. The method of operation of clause 20, wherein precharging the second bit line comprises precharging the second bit line to a memory power supply voltage.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A serial read write memory comprising:

a bank of bitcells arranged into a plurality of columns, wherein the plurality of columns includes a multiplexed group of columns;

a write column multiplexer configured to select for a write-selected column from the multiplexed group of columns during a write operation, wherein the multiplexed group of columns includes a write-unselected column;

a first precharge circuit configured to charge a first pair of bit lines in the write-selected column to a memory power supply voltage responsive to an assertion of a first bit line precharge signal;

a second precharge circuit configured to charge a second pair of bit lines in the write-unselected column to the memory power supply voltage responsive to an assertion of a second bit line precharge signal; and a precharge generation circuit configured to de-assert the first bit line precharge signal responsive to a read operation affecting the write selected column and until after the write operation.

2. The serial read write memory of claim 1, wherein the precharge generation circuit is further configured to assert the second bit line precharge signal during the write operation while the first bit line precharge signal remains de-asserted responsive to a read operation occurring to the bank of bitcells during an initial portion of a memory clock cycle, wherein the memory clock cycle is divided into the initial portion and a final portion, and wherein the write operation occurs during the final portion.

3. The serial read write memory of claim 2, wherein the bank of bitcells is further arranged into a plurality of rows, with each row traversed by a corresponding word line, and wherein the serial read write memory is further configured to charge a first word line during the read operation and to charge a second word line during the write operation.

4. The serial read write memory of claim 2, wherein the precharge generation circuit is further configured to latch the second bit line precharge signal during the read operation.

5. The serial read write memory of claim 2, wherein the first bit line precharge signal and the second bit line precharge signal are both active-low signals, and wherein the precharge generation circuit is further configured to assert the second bit line precharge signal by a discharge of the second bit line precharge signal to ground.

6. The serial read write memory of claim 1, wherein each bitcell comprises a six-transistor static-random-access memory bitcell.

7. The serial read write memory of claim 1, wherein the write-unselected column comprises a plurality of write-unselected columns.

8. The serial read write memory of claim 1, wherein the multiplexed group of columns includes only two columns.

9. The serial read write memory of claim 1, wherein the serial read write memory is included within a cellular telephone.

10. The serial read write memory of claim 1, further comprising:

a write driver configured to charge a first bit line in the first pair of bit lines during the write operation and configured to discharge a second bit line in the first pair of bit lines during the write operation.

11. The serial read write memory of claim 10, wherein the write column multiplexer is configured to couple the first bit line to a first write driver node during the write operation and to couple the second bit line to a second write driver node during the write operation, and wherein the write driver comprises:

a first transistor coupled between the first write driver node and ground;

a second transistor coupled between the first write driver node and a node for the memory power supply voltage;

a third transistor coupled between the second write driver node and ground; and a fourth transistor coupled between the second write driver node and the node for the memory power supply voltage.

12. The serial read write memory of claim 10, wherein the write driver is configured to couple the first bit line to a node for a memory power supply voltage during the write operation and configured to couple the second bit line to ground during the write operation.

13. The serial read write memory of claim 1, wherein the precharge generation circuit is configured to prevent a precharge of the first pair of bit lines between the read operation and the write operation.

14. A method of operation for a serial read write memory, comprising:

performing a read operation to a multiplexed group of columns during a first portion of a memory clock cycle, wherein the multiplexed group of columns includes a write-selected column and an at least one write-unselected column, and wherein the memory clock cycle is divided into the first portion and a second portion;

selecting for the write-selected column through a write column multiplexer to couple a bitcell in the write-selected column to a write driver in response to a termination of the first portion of the memory clock cycle while precharging a pair of bit lines in the at least one write-unselected column; and writing to a bitcell in the write-selected column using the write driver during the second portion of the memory clock cycle, wherein a pair of bit lines in the write-selected column are precharged prior to the read operation and are not precharged during the memory clock cycle.

15. The method of claim 14, wherein a first bit line in the pair of bit lines in the write-selected column discharges to a partially-discharged state during the read operation, and wherein the write driver discharges the first bit line from the partially-discharged state to a fully-discharged state during the second portion of the memory clock cycle.

16. The method of claim 14, further comprising:

asserting a word line voltage during the read operation; and asserting the word line voltage during the writing to the bitcell in the write-selected column.

17. A pseudo-dual-port memory, comprising:

a bank of bitcells arranged into a plurality of columns and into a plurality of rows, wherein the pseudo-dual-port memory is configured to assert a word line voltage for one of the rows during a read operation to the bank of bitcells in a first portion of a memory clock cycle a to assert the word line voltage during a write operation to a write-selected column in the plurali of columns in a second portion of the memory clock cycle; and a precharge generation circuit configured to control a precharge of each column prior to the read operation and to prevent a precharge of the write-selected column during the memory clock cycle.

18. The pseudo-dual-port memory of claim 17, further comprising:

a write multiplexer configured to select for the write-selected column during the write operation, wherein the write-selected column is included within a multiplexed group of column from the plurality of columns.

19. The pseudo-dual-port memory of claim 18, further comprising:

a write driver configured to couple a first bit line from a pair of bit lines in the write-selected column to a node for a memory power supply voltage during the write operation and configured to couple a second bit line from the pair of bit lines in the write-selected column to ground during the write operation.

20. A method of operation for a serial read write operation, comprising:

discharging a first bit line in a write-selected column from a pre-charged state to a partially-discharged state during a read operation in a first portion of a memory clock cycle;

fully discharging the first bit line from the partially-discharged state to ground during a write operation in a second portion of the memory clock cycle; and precharging a second bit line in a write-unselected column while fully discharging the first bit line, wherein the write-selected column is included within a group of multiplexed columns including the write-unselected column.

21. The method of operation of claim 20, wherein precharging the second bit line comprises precharging the second bit line to a memory power supply voltage.

* * * * *